United States Patent
Matsudaira et al.

(10) Patent No.: US 8,934,283 B2
(45) Date of Patent: Jan. 13, 2015

(54) SEMICONDUCTOR MEMORY DEVICE, SEMICONDUCTOR DEVICE AND METHOD OF MANUFACTURING SEMICONDUCTOR MEMORY DEVICE

(75) Inventors: Masaharu Matsudaira, Kanagawa (JP); Masayuki Terai, Kanagawa (JP)

(73) Assignee: Renesas Electronics Corporation, Kawasaki-Shi, Kanagawa (JP)

(*) Notice: Subject to any disclaimer, the term of this patent is extended or adjusted under 35 U.S.C. 154(b) by 79 days.

(21) Appl. No.: 13/553,764

(22) Filed: Jul. 19, 2012

(65) Prior Publication Data
US 2013/0077379 A1    Mar. 28, 2013

(30) Foreign Application Priority Data
Sep. 26, 2011   (JP) ................. 2011-209021

(51) Int. Cl.
*G11C 11/00* (2006.01)
*H01L 27/108* (2006.01)
*H01L 45/00* (2006.01)
*H01L 27/24* (2006.01)
(Continued)

(52) U.S. Cl.
CPC .... *H01L 27/10852* (2013.01); *H01L 27/10894* (2013.01); *H01L 45/04* (2013.01); *H01L 45/146* (2013.01); *H01L 45/1683* (2013.01); *H01L 27/2436* (2013.01); *H01L 28/91* (2013.01); *H01L 27/1052* (2013.01)
USPC ................ 365/148; 365/149; 365/51; 365/63

(58) Field of Classification Search
USPC ........ 365/148, 149, 51, 63, 158; 257/43, 312, 257/296, 4, E29.344
See application file for complete search history.

(56) References Cited

U.S. PATENT DOCUMENTS 7,405,958 B2   7/2008  Okazawa
7,439,569 B2 * 10/2008 Takeuchi ...................... 257/308
7,554,147 B2   6/2009  Asano et al.
(Continued)

FOREIGN PATENT DOCUMENTS

JP   2004-023062 A    1/2004
JP   2006-295130 A   10/2006
(Continued)

OTHER PUBLICATIONS

M. Fukuda, et al., "3.6-Times Higher Acceptable Raw Bit Error Rate, 97% Lower-Power, NV-RAM & NAND-Integrated Solid-State Drives (SSDs) with Adaptive Codeword ECC", Extended Abstracts of the 2010 International Conference on Solid State Devices and Materials, Tokyo, 2010, pp. 1166-1167.
(Continued)

*Primary Examiner* — David Lam
(74) *Attorney, Agent, or Firm* — McGinn IP Law Group, PLLC

(57) ABSTRACT

In a case where a DRAM and a ReRAM are mounted together, a manufacturing cost thereof is reduced while maintaining performance of a capacitance element and a variable resistance element. A semiconductor memory device includes a variable resistance element and a capacitance element. The variable resistance element has a cylinder type MIM structure with a first depth, and is designed for a variable resistance type memory. The capacitance element has a cylinder type MIM structure with a second depth deeper than the first depth, and is designed for a DRAM.

7 Claims, 15 Drawing Sheets

(51) Int. Cl.
*H01L 49/02* (2006.01)
*H01L 27/105* (2006.01)

(56) References Cited

U.S. PATENT DOCUMENTS

| | | | |
|---|---|---|---|
| 7,995,373 B2 | 8/2011 | Kajigaya et al. | |
| 8,017,457 B2 | 9/2011 | Kajigaya et al. | |
| 8,233,316 B2* | 7/2012 | Liu | 365/163 |
| 8,503,216 B2* | 8/2013 | Kajiyama | 365/148 |
| 8,687,403 B1* | 4/2014 | Derhacobian et al. | 365/148 |

| | | |
|---|---|---|
| 2011/0143506 A1 | 6/2011 | Lee |

FOREIGN PATENT DOCUMENTS

| | | |
|---|---|---|
| JP | 2008-282918 A | 11/2008 |
| JP | 2010-055731 A | 3/2010 |

OTHER PUBLICATIONS

Japanese Office Action dated Nov. 4, 2014 with an English translation thereof.

* cited by examiner

SEMICONDUCTOR MEMORY DEVICE, SEMICONDUCTOR DEVICE AND METHOD OF MANUFACTURING SEMICONDUCTOR MEMORY DEVICE

CROSS-REFERENCE TO RELATED APPLICATIONS

The disclosure of Japanese Patent Application No. 2011-209021 filed on Sep. 26, 2011 including the specification, drawings and abstract is incorporated herein by reference in its entirety.

BACKGROUND

The present invention relates to a semiconductor memory device, a semiconductor device, and a method of manufacturing a semiconductor memory device. In particular, it relates to a semiconductor memory device on which a ReRAM and a DRAM are mounted, a semiconductor device, and a method of manufacturing a semiconductor memory device.

For the purpose of saving data, a technology for mounting a volatile memory and a non-volatile memory on a single conductor chip has been expected. There is a method, for example, in which, using a DRAM (Dynamic Random Access Memory) as a cache, data is written to a NAND flash memory. While the transfer speed of DRAM has been accelerated, the transfer speed of the NAND flash memory is decreasing as its capacity increases. Therefore, in a method where data is written to the NAND flash memory using the DRAM as a cache, there occur problems as follows. That is, the number of the NAND flash memories to which data are written in parallel increases. Also, more electricity is consumed when data are written.

As a non-volatile memory for reducing the difference in speed, a ReRAM (Resistance Random Access Memory), whose writing speed is faster than that of the NAND flash memory, is receiving attention. For example, Non-Patent Document 1 discloses that when a ReRAM is used as a cache memory and a method of sequentially wiring data temporarily stored in the ReRAM to the NAND flash memory sequentially is adopted, power consumption at the time of data writing is reduced by 97% and an acceptable raw bit error rate becomes 3.6 times higher.

The DRAM and the ReRAM have the same MIM (Metal-Insulator-Metal) structures. Therefore, they can be manufactured simultaneously by using the same material. For example, Patent Document 1 (Japanese Patent Laid-open No. 2008-282918 (Corresponding US Application: U.S. 2008280415 A1)) discloses a structure where, between a capacitance element and a variable resistance element, materials of at least one of an upper electrode and a lower electrode are different but the remaining materials are the same and are manufactured in the same manufacturing process. Moreover, Patent Document 2 (Japanese Patent Laid-open No. 2010-55731 (Corresponding US Patent: U.S. Pat. No. 7,995,373 B2)) discloses a technique in which the forming is performed, in a memory cell array of a DRAM, for memory cells in a selected area, and thereby the memory cells are changed to non-volatile memory cells.

[Patent Document 1]
Japanese Patent Laid-open No. 2008-282918
[Patent Document 2]
Japanese Patent Laid-open No. 2010-55731
[Non-patent Document 1]
M. Fukuda, et al., "3.6-Times Higher Acceptable Raw Bit Error Rate, 97% Lower-Power, NV-RAM & NAND-Integrated Solid-State Drives (SSDs) with Adaptive Codeword ECC", Extended Abstracts of the 2010 International Conference on Solid State Devices and Materials, Tokyo, 2010, pp 1166-1167

SUMMARY

The technologies of the documents described above have the following problems. In Non-patent Document 1, when the ReRAM is used as a cache memory instead of a DRAM, the manufacturing cost is not sufficiently reduced. The case to be discussed is that the DRAM is used as a volatile memory and that which device is to be adopted as a non-volatile memory.

According to Patent Documents 1 and 2, it is possible to hold down a manufacturing cost by using the same material for forming the capacitance element and the variable resistance element and by allowing the manufacturing process to be partially shared. However, sufficient performances cannot be obtained for both the capacitance element and the variable resistance element. For example, the increase in capacity of DRAM is called for. Therefore, in terms of structure, an insulating film material is promoted to have High k and an MIM area has been increased. On the other hand, in the ReRAM, since a parasitic capacitance of the MIM prevents the improvement in performance of the ReRAM, it is necessary to reduce its capacity.

In the case where the DRAM and the ReRAM are mounted on a single chip, there is called for a technology which can sufficiently reduce a manufacturing cost while sufficiently maintaining the performance of both the capacitance element and the variable resistance element.

With reference to numerals and characters to be used in embodiments below, means for solving the problems will be explained. In order to clarify the corresponding relationship with claims and the embodiments, the numerals and characters are appended with parentheses. However, these numerals and characters should not be used for interpretation of a technical scope of the inventions described in the claims.

A semiconductor memory device of the present invention includes: a variable resistance element (1) of a variable resistance type memory; and a capacitance element (101) of a DRAM (Dynamic Random Access Memory). The variable resistance element (1) of the variable resistance type memory has a cylinder type MIM (Metal-Insulator-Metal) structure with a first depth (D1). The capacitance element (101) of the DRAM has a cylinder type MIM structure with a second depth (D2) which is deeper than the first depth (D1).

The semiconductor device of the present invention includes semiconductor memory devices (90, 190) and an information processing circuit (200). The semiconductor memory devices (90, 190) are described above. The information processing circuit (200) processes information using the semiconductor memory devices (90, 190).

A method of manufacturing the semiconductor memory device of the present invention includes the steps of: providing a first opening (81) having a first depth (D1) in an interlayer insulating layer over a substrate (40); providing a second opening (181) having a second depth (D2) deeper than the first depth (D1) in the interlayer insulating layer; forming a first lower electrode (13) of a variable resistance element (1) of a variable resistance type memory over a bottom portion and a side surface of the first opening (81) and forming a second lower electrode (113) of a capacitance element (101) of a DRAM (Dynamic Random Access Memory) over a bottom portion and a side surface of the second opening (181); stacking an insulating film (84) and a second conductive film (85), in this order, so as to cover a surface of the interlayer insulating layer, the first lower electrode (13), and the second lower electrode (113); and forming a variable resistance layer (12) of the variable resistance element (1) and a first upper electrode (11) over the first lower electrode (13) and forming a capacitance insulating film (112) of the capacitance element (101) and a second upper electrode (111) over the second lower electrode (113), respectively, by performing etching of the insulating film (84) over the interlayer insulating layer and the second conductive film (85) in a region except the inside of the first opening (81) and the second opening (181) as well as the periphery thereof.

According to the present invention, when mounting a DRAM and a variable resistance type memory on a single chip, the manufacturing cost can be reduced while maintaining the performance of a capacitance element and a variable resistance element.

DETAILED DESCRIPTION

Now, the embodiments of the semiconductor memory device, the semiconductor device, and the method of manufacturing the semiconductor memory device according to the present invention will be described with reference to the accompanying drawings.

First Embodiment

Figure 1:
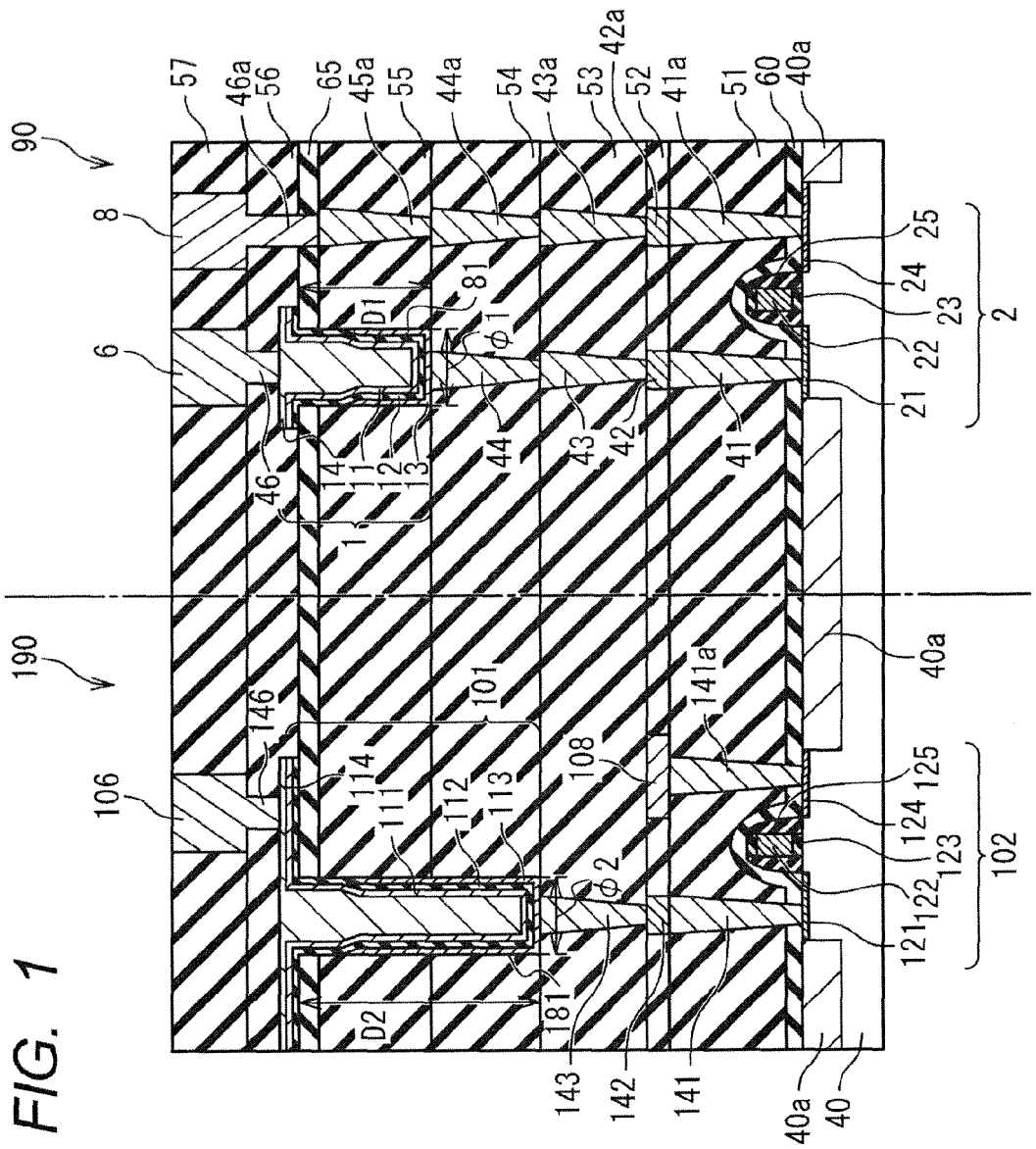
FIG. 1 is a sectional view showing an example of a configuration of a semiconductor memory device according to a first embodiment of the present invention.

A semiconductor memory device according to a first embodiment of the present invention will be described with reference to the accompanying drawings. FIG. 1 is a sectional view showing an example of a configuration of the semiconductor memory device according to the first embodiment of the present invention. The semiconductor memory device includes: a variable resistance type memory section 90 and a DRAM section 190. The variable resistance type memory section 90 includes a variable resistance type memory cell of a 1T1R (1 transistor 1 resistor) type. The memory cell contains: a variable resistance element 1 having a cylinder type MIM (Metal-Insulator-Metal) structure; and a transistor 2. Also, the DRAM section 190 includes a memory cell of a DRAM. The memory cell contains: a capacitance element 101 having a cylinder type MIM structure; and a transistor 102. In FIG. 1, however, a structure of one variable resistance type memory cell is shown in the variable resistance type memory section 90, and a structure of one memory cell of the DRAM is shown in the DRAM section 190.

First, the variable resistance type memory section 90 will be described. In a region surrounded by an element isolation region 40a, the transistor 2 is formed over a semiconductor substrate 40. The transistor 2 includes: a gate insulating film 23; agate 22 (a word line); a drain 21; a source 24; and a sidewall 25. Further, as compared to the transistor 102 to be described later, the transistor 2 has a higher withstand voltage. It is because a higher voltage is impressed to the transistor 2 as compared to the transistor 102 and greater current flows in the transistor 2. A higher withstand voltage of the transistor 2 can be achieved by, for example, allowing the gate insulating film 23 to be thicker than a gate insulating film 123. Alternatively, the higher withstand voltage may be achieved by other existing methods (for example, by making the gate longer). The transistor 2 is covered with an interlayer insulating layer stacked over the substrate 40. The interlayer insulating layer is made by stacking an interlayer insulating film 60, interlayer insulating films 51, 52, 53, 54, and 55, a cap insulating film 65, and interlayer insulating films 56 and 57, in this order. The drain 21 is coupled to the variable resistance element 1 through a contact 41 penetrating the interlayer insulating film 60 and the interlayer insulating films 51 to 54, a first wiring 42, and vias 43 and 44.

The variable resistance element 1 is formed in a first opening 81 which extends from a surface of the cap insulating film 65 toward the interlayer insulating layer 55 and which has a first depth D1 and a diameter φ1. There is the via 44 at the bottom of the first opening 81. Also, as long as a filament can be formed in the forming, there is no restriction on the diameter φ1. From an aspect of reduction in element area or parasitic capacitance, it is preferable that the diameter φ1 is smaller. The variable resistance element 1 has a cylinder type MIM structure. The MIM structure includes an upper electrode 11, a variable resistance layer 12, and a lower electrode 13. The MIM structure may have an embedded electrode 14. The lower electrode 13 is so formed as to cover the bottom and an internal side surface of the first opening 81. However, it may be so formed as to cover the internal side surface halfway. In the example of FIG. 1, the lower electrode 13 covers the internal side surface halfway. The variable resistance layer 12 is so provided as to cover the lower electrode 13 and an upper internal surface of the first opening 81. The upper electrode 11 is so provided as to cover the variable resistance layer 12. The embedded electrode 14 is so provided as to cover the upper electrode 11 and fill in the first opening 81. The embedded electrode 14 is coupled to a second wiring 6 (for example, a bit line) through a via 46 which penetrates the interlayer insulating layer 56.

The source 24 is coupled to a common line 8 (for example, a ground line) through the interlayer insulating film 60, the interlayer insulating films 51 to 55, the cap insulating film 65, a contact 41a penetrating the interlayer insulating film 56, a first wiring 42a, and vias 43a, 44a, 45a, and 46a. Side surfaces of the second wiring 6 and the common line 8 are covered with the interlayer insulating film 57.

Next, the DRAM section 190 will be described. In a region surrounded by the element isolation region 40a, the transistor 102 is formed over the semiconductor substrate 40. The transistor 102 includes the gate insulating film 123, a gate 122 (a word line), a drain 121, a source 124, and a side all 125. As described above, the withstand voltage of the transistor 102 is lower than that of the transistor 2. The transistor 102 is covered with an interlayer insulating layer stacked over the substrate 40. The interlayer insulating layer is made by stacking the interlayer insulating film 60, the interlayer insulating films 51, 52, 53, 54, and 55, the cap insulating film 65, and interlayer insulating films 56 and 57, in this order. The drain 121 is coupled to the capacitance element 101 through a contact 141, a first wiring 142, and a via 143 which penetrate the interlayer insulating film 60 and the interlayer insulating films 51 to 53.

The capacitance element 101 is formed in a second opening 181 having a second depth D2 and a diameter φ2 extending from a surface of the cap insulating film 65 toward the interlayer insulating layers 55 and 54. There is the via 143 at a bottom of the second opening 181. However, the second depth D2 is deeper than the first depth D1. There is no restriction on the diameter φ2. It may be larger than the diameter φ1. Alternatively, it may be as large as the diameter φ1, or smaller than the diameter φ1. The capacitance element 101 has a cylinder type MIM structure. The MIM structure includes an upper electrode 111, a capacitance insulating film 112, and a lower electrode 113. The MIM structure may have an embedded electrode 114. The lower electrode 113 is so formed as to cover the bottom and an internal side surface of the second opening 181. However, the lower electrode 113 may be formed so as to cover the inner side surface halfway. In the example of FIG. 1, the lower electrode 113 covers the inner side surface halfway. The capacitance insulating film 112 is so provided as to cover the lower electrode 113 and the upper internal surface of the second opening 181. The upper electrode 111 is so provided as to cover the capacitance insulating film 112. The embedded electrode 114 is so provided as to cover the upper electrode 111 and fill in the second opening 181. The embedded electrode 114 is coupled to a second wiring 106 (a common line) through a via 146 which penetrates the interlayer insulating layer 56.

The source 124 is coupled to a bit line 108 through a contact 141a which penetrates the interlayer insulating film 60 and the interlayer insulating film 51. A side surface of the bit line 108 is covered with the interlayer insulating film 52. As shown in FIG. 1, the surface region of the substrate 40 and each layer play similar roles in both the variable resistance type memory section 90 and in the DRAM section 190.

It is preferable that the variable resistance element 1 of the variable resistance type memory section 90 and the capacitance element 101 of the DRAM section 190 are made using the same material. Specifically, it is preferable that the upper electrode 11 of the variable resistance element 1, the variable resistance layer 12, and the lower electrode 13 are formed using the same material as that of the upper electrode 111 of the capacitance element 101, the capacitance insulating film 112, and the lower electrode 113. By using the same material, those components can be formed simultaneously and at a low cost.

The upper electrodes 11 and 111 and the lower electrodes 13 and 113 contain, for example, titanium (Ti), titanium nitride (TiN), aluminum (Al), nickel (Ni), copper (Cu), copper aluminum (CuAl), tantalum (Ta), tantalum nitride (TaN), zirconium (Zr), hafnium (Hf), molybdenum (Mo), ruthenium (Ru) platinum (Pt), etc. Alternatively, the upper electrodes 11, 111 and the lower electrodes 13, 113 may be stacked structures of the materials described above.

Moreover, the insulating films (the variable resistance layer 12 and the capacitance insulating film 112) contain titanium oxide ($TiO_2$), iron oxide (FeO), nickel oxide (NiO) zirconium oxide ($ZrO_2$), copper oxide (CuO), hafnium oxide ($HfO_2$), tantalum oxide ($Ta_2O_5$), and tungsten oxide WO. Alternatively, the above insulating films may include a single-layer film or a stacked layer film containing at least the nitrides of the above or a silicate.

Moreover, tungsten (W), aluminum (Al), and copper (Cu) can be used for the contact, via, embedded electrode, wiring, etc. As required, a stacked layer film with a barrier film (for example, Ta, TaN) can be used.

Moreover, it is preferable that (an end portion of) the upper electrode 11 of the variable resistance element 1 and (an end portion of) the upper electrode 111 of the capacitance element 101 are provided in one plane. In other words, it is preferable that an upper end of the first opening 81 and an upper end of the second opening 181 are in one plane. By providing them in one plane, the vias 46 and 146 for coupling respective upper electrodes 11, 111 and the second wirings 6 and 106 in the upper layer can be formed simultaneously.

Next, a description will be given of a method of operating the semiconductor memory device according to the first embodiment of the present invention. The cylinder type MIM formed in the variable resistance type memory section 90 is operated as a variable resistance element 1 as follows. First, in order to perform the forming, through the second wiring 6, a positive voltage is impressed to the upper electrode 11 for allowing it to be less resistive. At this time, it is preferable that a load resistor (the transistor 2 coupled to the variable resistance element 1) is coupled to the variable resistance element 1 so that too much electric current may not flow after the reduction in resistance. With respect to the forming, a positive voltage may be impressed to the lower electrode 13 through the transistor 2 instead of the upper electrode 11. According to the forming operation, there is formed a less resistive switching path (filament) in the variable resistance layer 12 (insulating film) sandwiched between the upper electrode 11 and the lower electrode 13, serving as a variable resistance element 1. Next, when switching from a state of low resistance to a state of high resistance, a positive voltage is impressed to the upper electrode 11. At this time, it is preferable that the resistance of the load resistor (the transistor 2) is lowered so that more current may flow than in the state during the forming. On the other hand, when switching to the state of low resistance from the state of high resistance, a positive voltage is impressed to the upper electrode 11. At this time, a voltage higher than the one during the switching to the state of high resistance is impressed to the upper electrode 11. Moreover, as in the case of the forming, it is preferable that a load resistor is coupled to the variable resistance element 1 so that too much current may not flow after the reduction in resistance. In addition, a positive voltage may be impressed to the lower electrode 13 instead of the upper electrode 11.

According to the present embodiment, the cylinder type MIM formed in the variable resistance type memory section 90 is shallower than that of the DRAM section 190. Therefore, an area of the MIM becomes smaller and the capacitance is reduced. As a result, the parasitic capacitance of the variable resistance element 1 decreases, achieving a faster operation of the variable resistance type memory. Moreover, the variable resistance type memory may be a ROM to which data can be written only once.

On the other hand, the cylinder type MIM formed in the DRAM section 190 functions as a capacitance element 101 of the DRAM. That is, because of electric charges accumulated in the capacitance element 101, recording of two states ("1" and "0") is achieved.

Next, a description will be given of a method of manufacturing the semiconductor device according to the first embodiment of the present invention. FIGS. 2 to 7 are sectional views showing the method of manufacturing the semiconductor device according to the first embodiment of the present invention. However, the manufacturing method of an example of the configuration of FIG. 1 will be explained here.

Figure 2:
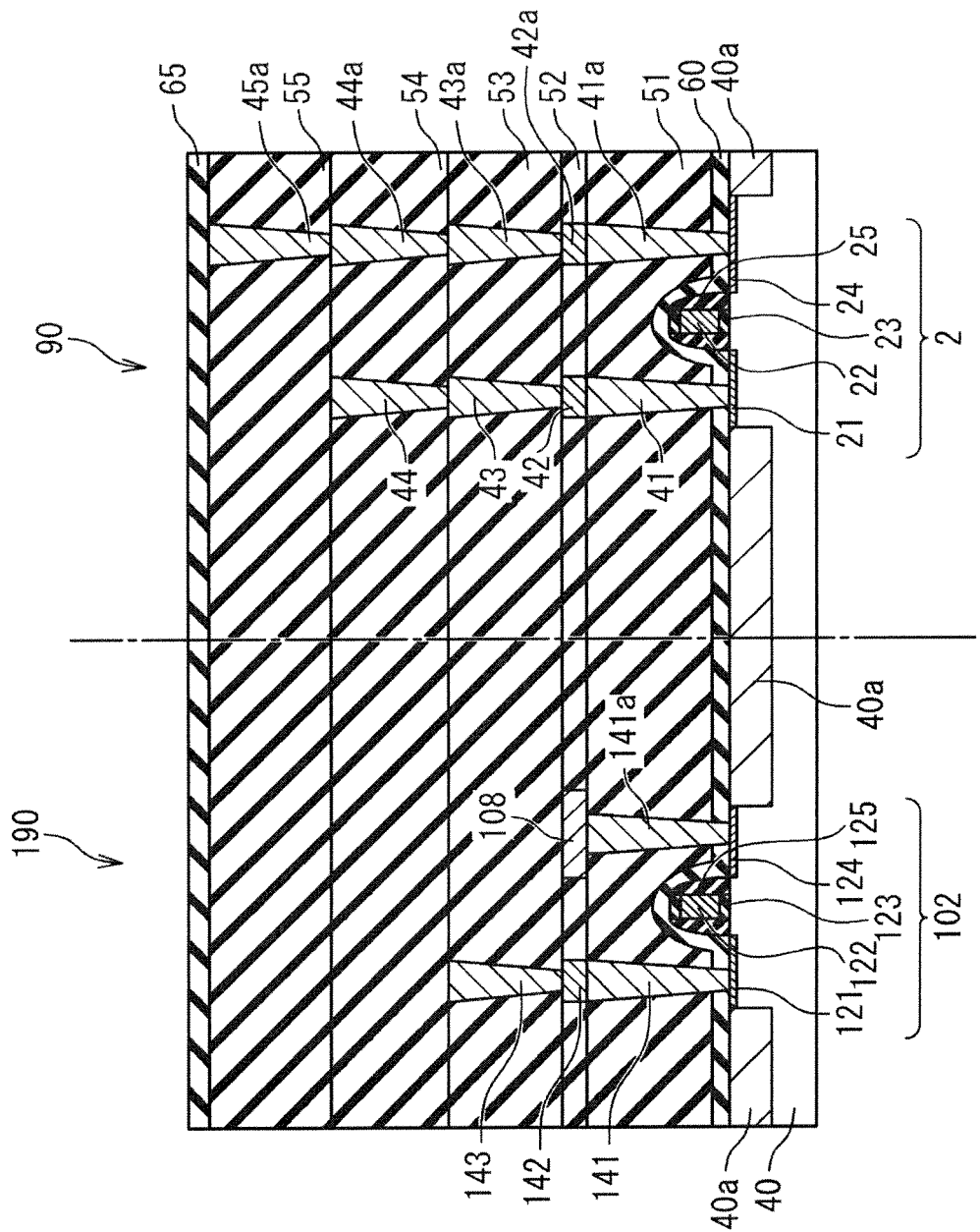
FIG. 2 is a sectional view showing a method of manufacturing a semiconductor device according to the first embodiment of the present invention.

First, as shown in FIG. 2, in the variable resistance type memory section 90 and the DRAM section 190, over the semiconductor substrate 40, with use of a regular MOSFET process, there are formed an element isolation region 40a, the transistor 2 (a gate 22, a gate insulating film 23, a source 24, a drain 21, and a sidewall 25), and the transistor 102 (a gate 122, a gate insulation film 123, a source 124, a drain 121, and a sidewall 125). In this regard, a material used for the semiconductor substrate 40 is p-silicon (Si), a material used for the gate insulating films 23 and 123 is a silicon oxide film (SiOx), a material used for the gates 22 and 122 is a polysilicon film (poly-Si), a material used for the sources 24 and 124 and the drains 21 and 121 is n+silicon (n+Si), and a material used for the sidewalls 25 and 125 is a silicon nitride film (SiNx), respectively.

In this regard, the gate insulating film 23 is formed thicker than the gate insulating film 123. For example, after once thermally oxidizing the whole surface of the semiconductor substrate 40, etching of the thermally oxidized film alone of the DRAM section 190 is performed and the whole surface of the semiconductor substrate 40 is thermally oxidized again. As a result, the gate insulating film 23 on the side of the variable resistance type memory section 90 becomes thicker by being thermally oxidized twice. Thus, the gate insulating film 123 on the side of the DRAM section 190 is thermally oxidized only once, becoming thin.

Next, in the variable resistance type memory section 90 and the DRAM section 190, there are stacked, over upper portions thereof, an interlayer insulating film 60, the interlayer insulating films 51, 52, 53, 54, and 55, and the cap insulating film 65, in this order. At this time, using a PR (photoresist) process and a dry etching process, in the interlayer insulating film 60 and the interlayer insulating film 51, contacts 41 and 41a are formed over the drain 21 and the source 24. Also, contacts 141 and 141a are formed over the drain 121 and the source 124. Further, in the interlayer insulating film 52, the first wirings 42 and 42a are formed over the contacts 41 and 41a, and a first wiring 142 and the bit line 108 are formed over the contacts 141 and 141a. Still further, in the interlayer insulating film 53, vias 43 and 43a are formed over the first wirings 42 and 42a, and a via 143 is formed over the first wiring 142. Still further, in the interlayer insulating film 54, vias 44 and 44a are formed over the vias 43 and 43a. Still further, in the interlayer insulating film 55, a via 45a is formed over the via 44a. The contact 41, the first wiring 42, and the vias 43 and 44 can be regarded as contacts which couple the transistor 2 with the variable resistance element 1. Similarly, the contact 41a, the first wiring 42a, and the vias 43a to 46a can be regarded as contacts which couple the transistor 2 with the common line 8. Similarly, the contact 141, the first wiring 142, and the via 143 can be regarded as contacts which couple the transistor 102 with the capacitance element 101.

Figure 3:
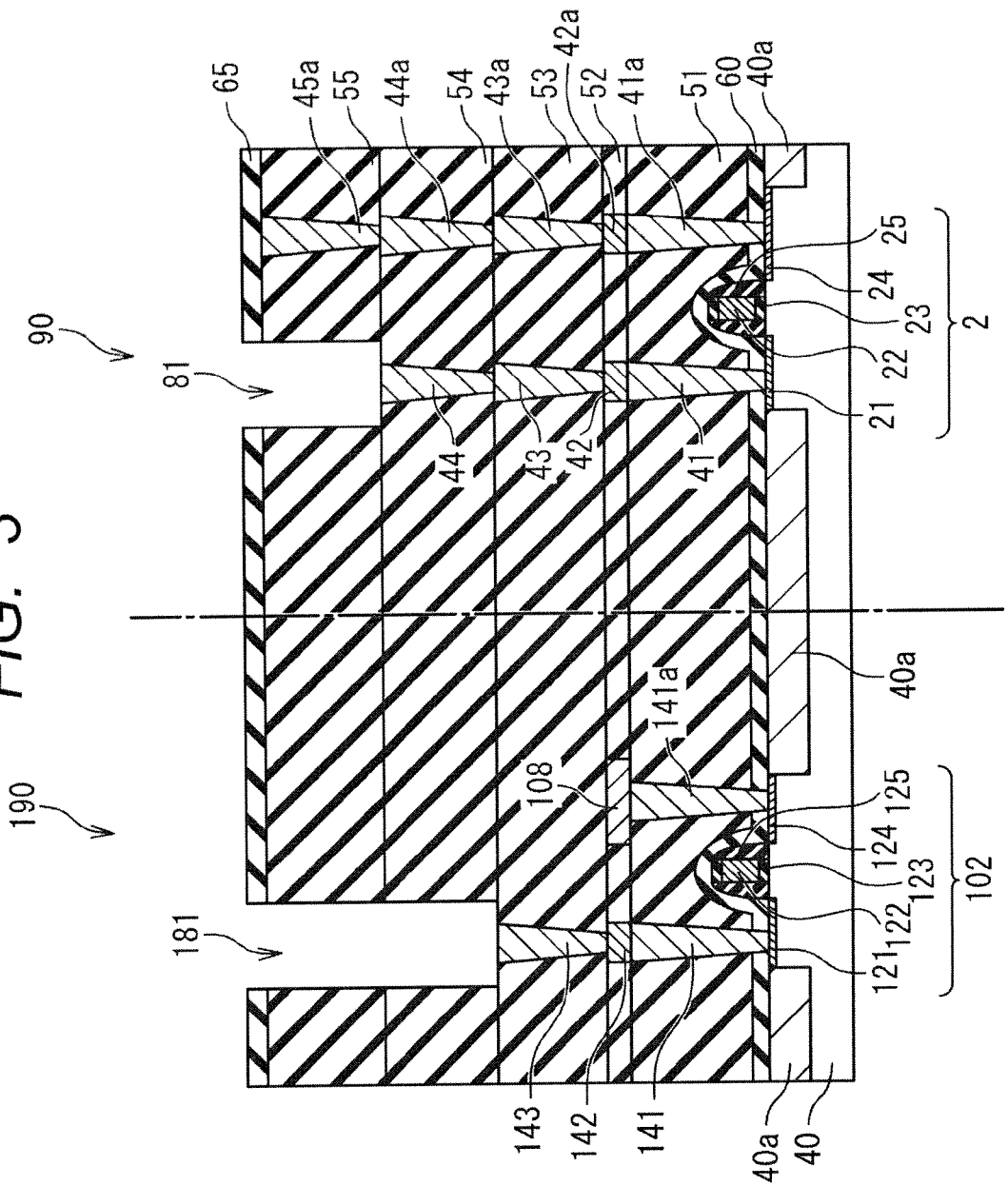
FIG. 3 is a sectional view showing the method of manufacturing the semiconductor device according to the first embodiment of the present invention.

Next, as shown in FIG. 3, in the variable resistance type memory section 90, with use of the PR process and the dry etching process, the first opening 81 (depth D1, diameter φ1) is so formed as to penetrate the cap insulating film 65 and the interlayer insulating film 55 to be located over the via 44. The etching depth (D1) is adjusted according to the etching rate. Moreover, in the DRAM section 190, with use of the PR process and the dry etching process, the second opening 181 (depth 52, diameter φ2) is so formed as to penetrate the cap insulating film 65 and the interlayer insulating films 55 and 54 to be located over the via 143. The etching depth (D2) is adjusted according to the etching rate.

Figure 4:
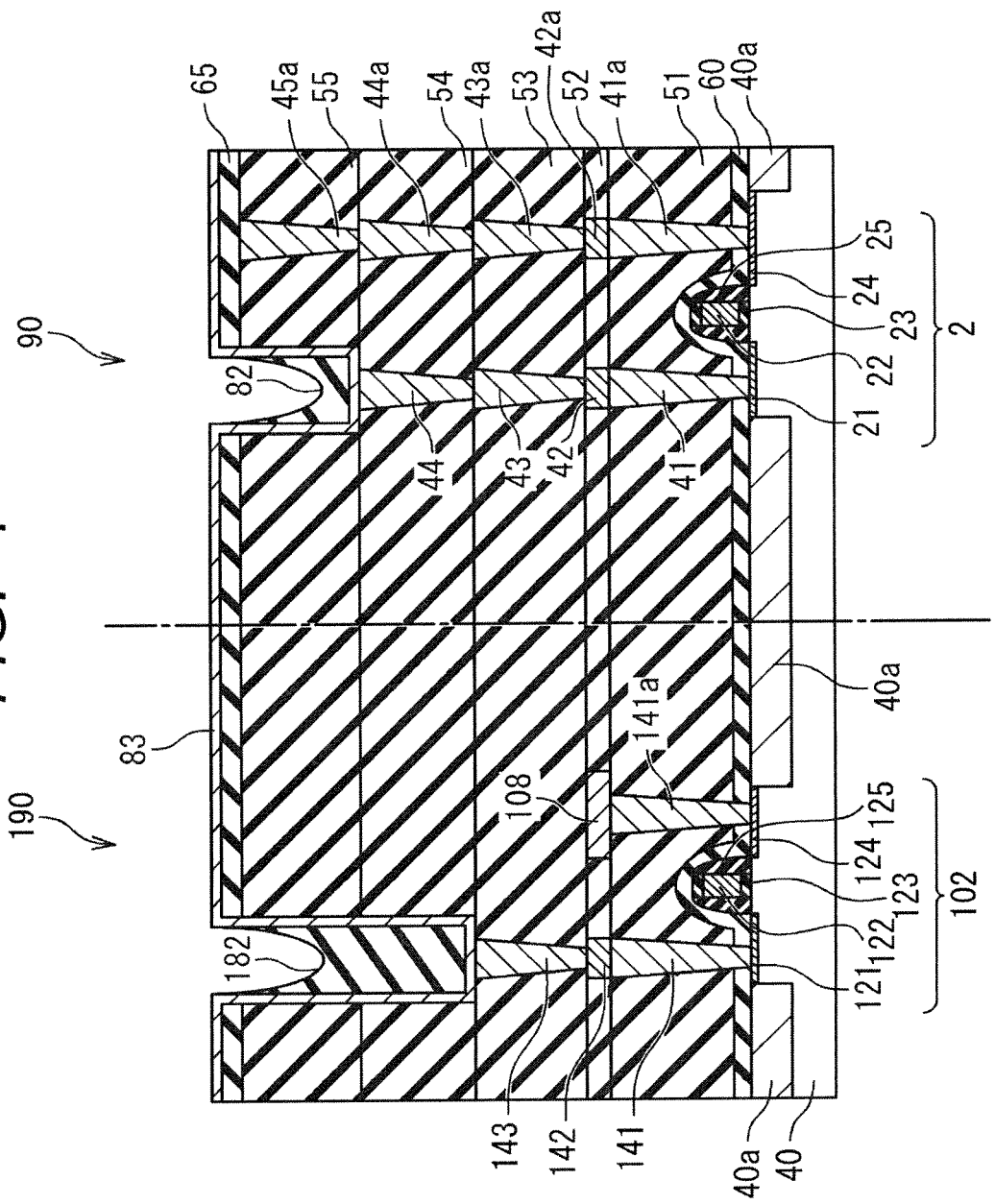
FIG. 4 is a sectional view showing the method of manufacturing the semiconductor device according to the first embodiment of the present invention.

Then, as shown in FIG. 4, in the variable resistance type memory section 90 and the DRAM section 190, a conductive film 83 for the lower electrode film is formed so as to cover a surface of the cap insulating film 65 and inner surfaces (side surfaces and bottom surfaces) of the first opening 81 and the second opening 181. Then, resists 82 and 182 are embedded into the first opening 81 and the second opening 181 by the coating method. At this time, the resists 82 and 182 cover at least the side surfaces and the bottom surfaces of the first openings 81 and the second openings 181. However, upper side surfaces thereof may not be covered. In that case, the conductive films 83 of the upper side faces of the first opening 81 and the second opening 181 are exposed.

Figure 5:
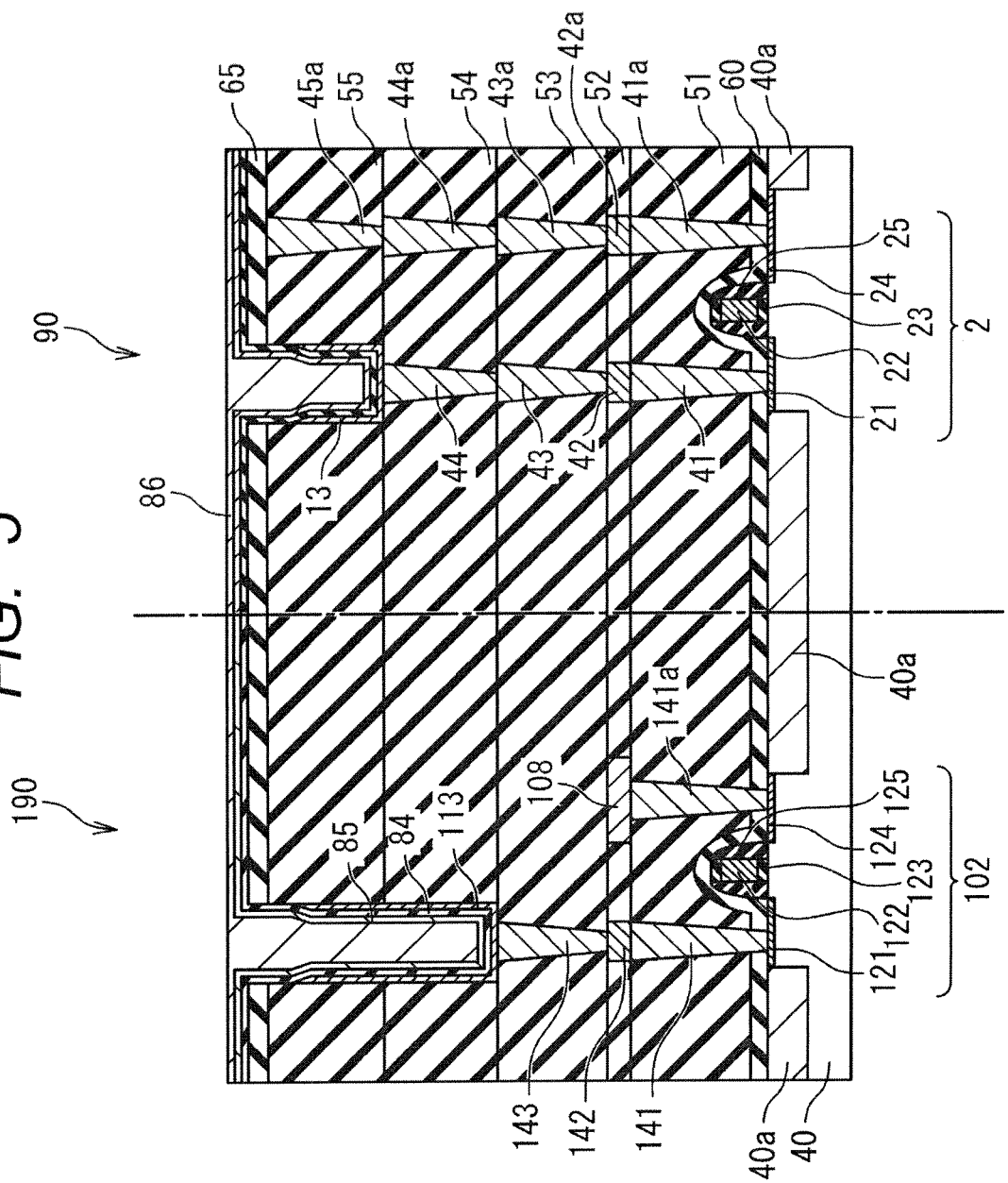
FIG. 5 is a sectional view showing the method of manufacturing the semiconductor device according to the first embodiment of the present invention.

Next, as shown in FIG. 5, in the variable resistance type memory section 90 and the DRAM section 190, portions of the conductive film 83 not covered with the resists 82 and 182 are etched. As a result, when the resists 82 and 182 do not cover the upper side surfaces, the lower electrode 13 of the variable resistance element 1 is formed over the side surface and the bottom surface not reaching a level of a position of the opening end of the first opening 81, and the lower electrode 113 of the capacitance element 101 is formed over the side surface and the bottom surface not reaching a level of a position of the opening end of the second opening 181. On the other hand, when the resists 82 and 182 cover the upper side surface, the lower electrode 13 of the variable resistance element 1 is formed over the side surface and the bottom surface reaching the level of the position of the opening end of the first opening 81, and the lower electrode 113 of the capacitance element 101 is formed over the side surface and the bottom surface reaching the level of the position of the opening end of the second opening 181. Subsequently, the resists 82 and 182 in the first opening 81 and the second opening 181 are removed. Then, so as to cover the surface of the cap insulating layer 65 and the lower electrodes 13 and 113, an insulating film 84 for the variable resistance layer or the capacitance insulation film, a conductive film 85 for the upper electrode, and a conductive film 86 for the embedded conductive film are stacked in this order.

Figure 6:
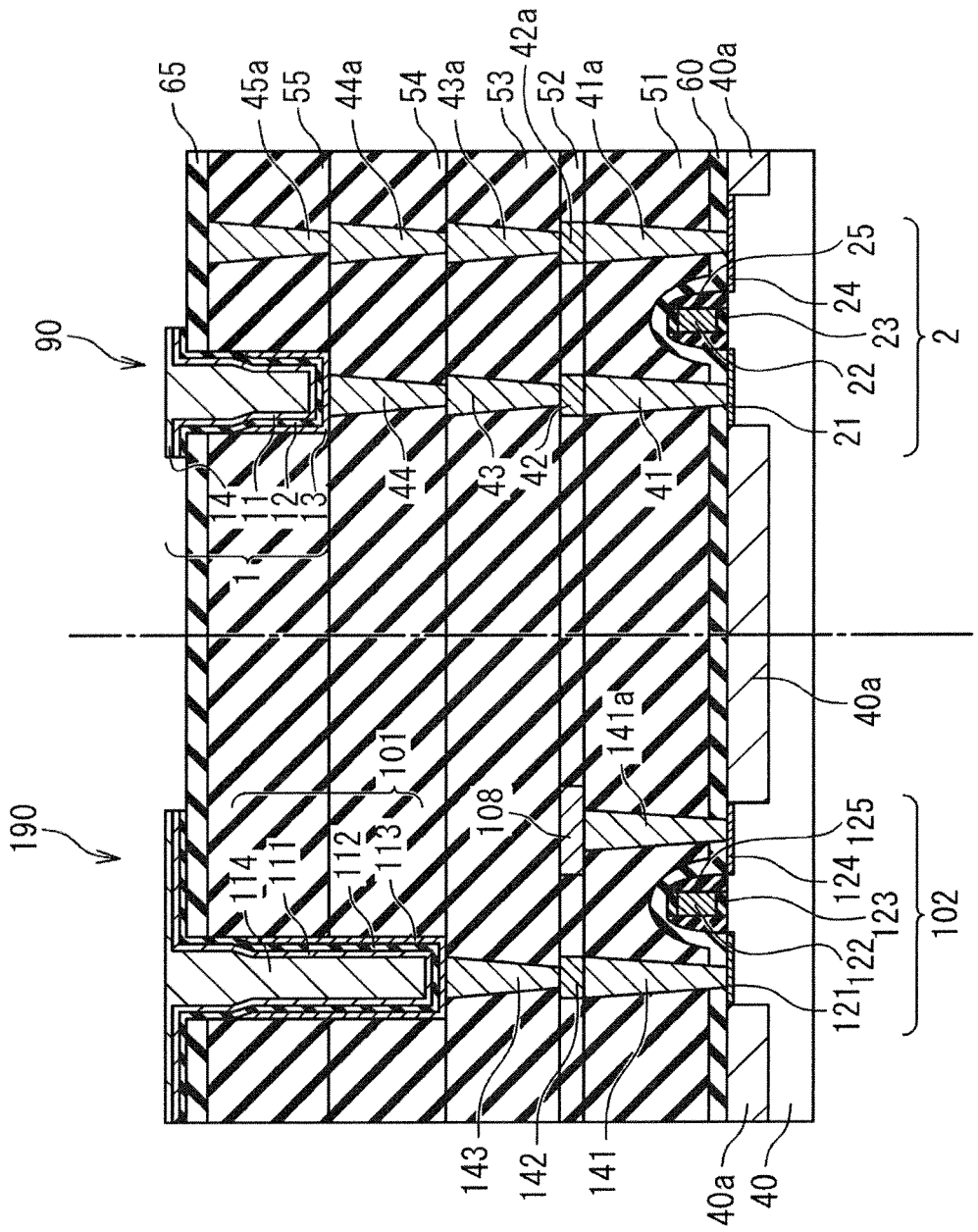
FIG. 6 is a sectional view showing the method of manufacturing the semiconductor device according to the first embodiment of the present invention.

Then, as shown in FIG. 6, in the variable resistance type memory section 90 and the DRAM section 190, with use of the PR process and the dry etching process, the insulating film 84, the conductive film 85, and the conductive film 86 in a region excluding a region of the first opening 81 and its periphery and a region where the capacitance element 101 is disposed is processed by etching treatment. Accordingly, the variable resistance layer 12 of the variable resistance element 1, the upper electrode 11, and the embedded electrode 14 are formed over the lower electrode 13. Further, the capacitance insulating film 112 of the capacitance element 101, the upper electrode 111, and the embedded electrode 114 are formed over the lower electrode 113 (however, the capacitance insulating film 112 of the capacitance element 101, the upper electrode 111, and the embedded electrode 114 are shared by two or more capacitance elements in the region where the capacitance element 101 is disposed)

Figure 7:
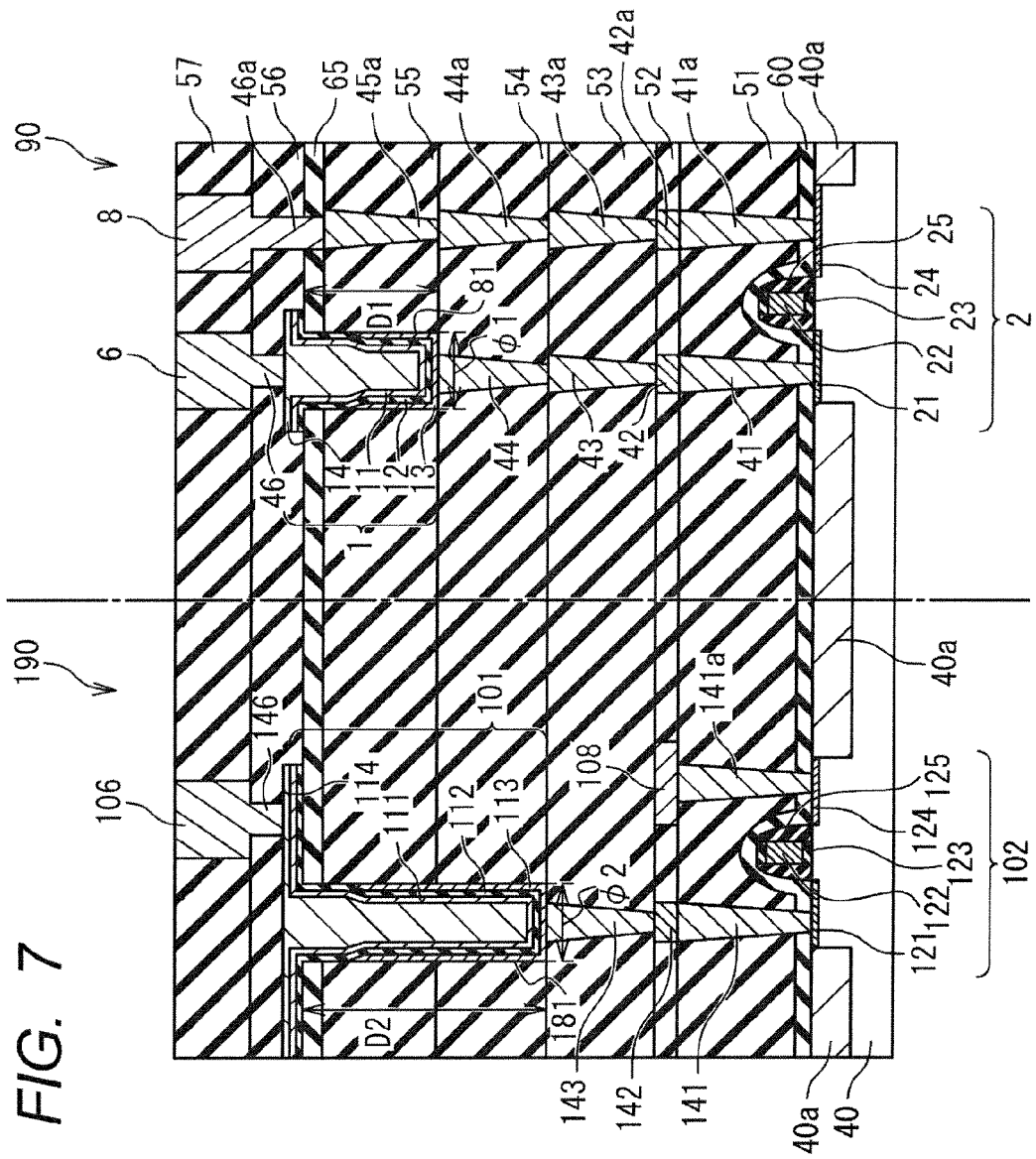
FIG. 7 is a sectional view showing the method of manufacturing the semiconductor device according to the first embodiment of the present invention.

Next, as shown in FIG. 7, the interlayer insulating films 56 and 57 are stacked in this order over the variable resistance type memory section 90 and the DRAM section 190. At this time, using the PR (photoresist) process and the dry etching process, in the interlayer insulating film 56, vias 46 and 46a are formed over the embedded electrode 14 and the via 45a, and a via 146 is formed over the embedded electrode 114. Furthermore, in the interlayer insulating film 57, the second wiring 6 and the common line 8 are formed over the vias 46 and 46a, and the second wiring 106 is formed over the via 146.

Accordingly, the semiconductor device of the first embodiment of the present invention is manufactured.

Thus, in the present embodiment, except for allowing the depth of the first opening 81 of the variable resistance element 1 and the depth of the second opening 181 of the capacitance element 101 to be different, the formation of the capacitance element 101 and the formation of the variable resistance element 1 can be achieved by the same process. Accordingly, while suppressing the factors which prevent the improvement in performance of the DRAM and the ReRAM, it becomes possible to simplify the manufacturing process in the case of mounting the DRAM and the ReRAM together over a single semiconductor substrate and to reduce the manufacturing cost thereof. Moreover, the first opening 81 of the variable resistance element 1 is shallower than the second opening 181 of the capacitance element 101. That is, an area of the cylinder type MIM of the variable resistance element 1 is smaller than that of the cylinder type MIM of the capacitance element 101. As a result, the capacitance of the variable resistance element 1 is reduced, and the faster operational speed of the variable resistance type memory can be realized.

Figure 8:
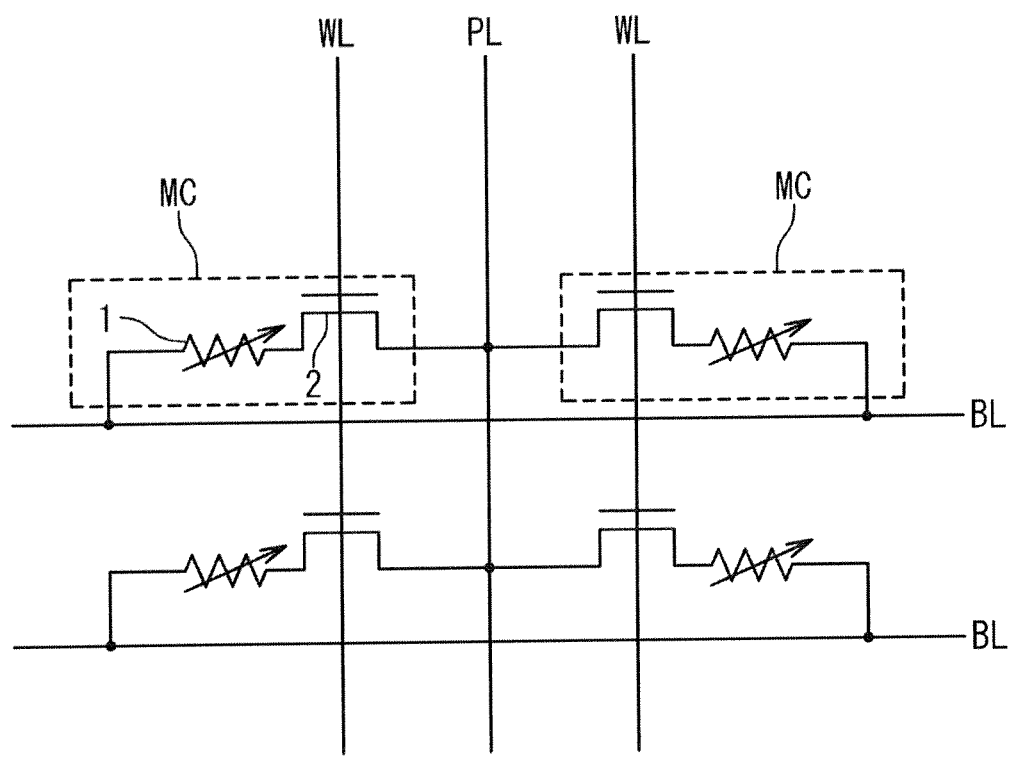
FIG. 8 is a circuit diagram showing an example of a circuit configuration of a variable resistance memory section.

Incidentally, in order to reduce an area of the variable resistance memory section 90, for example, there can be considered a method where the common line 8 is shared by adjacent memory cells. FIG. 8 is a circuit diagram showing an example of a circuit configuration of the variable resistance memory section 90. The variable resistance memory section 90 includes: two or more bit lines BL extending in x-direction; two or more word lines WL extending in y-direction; and two or more memory cells MC provided, respectively, at intersection points of the two or more bit lines BL and the two or more word lines WL. The two or more memory cells MC are arranged in a matrix. The memory cell MC includes the transistor 2 and the variable resistance element 1. One of the source/drain of the transistor 2 is coupled to the common line PL and the other of the source/drain is coupled to one end of the variable resistance element 1. The other end of the variable resistance element 1 is coupled to the bit line BL. At this time, by allowing the adjacent memory cells MC to share the common line 8 and the source 24 of the transistor 2, a region necessary for wiring of the common line PL and arrangement of the source 24 of the transistor 2 can be saved by one row per two rows of the memory cells MC.

Figure 9:
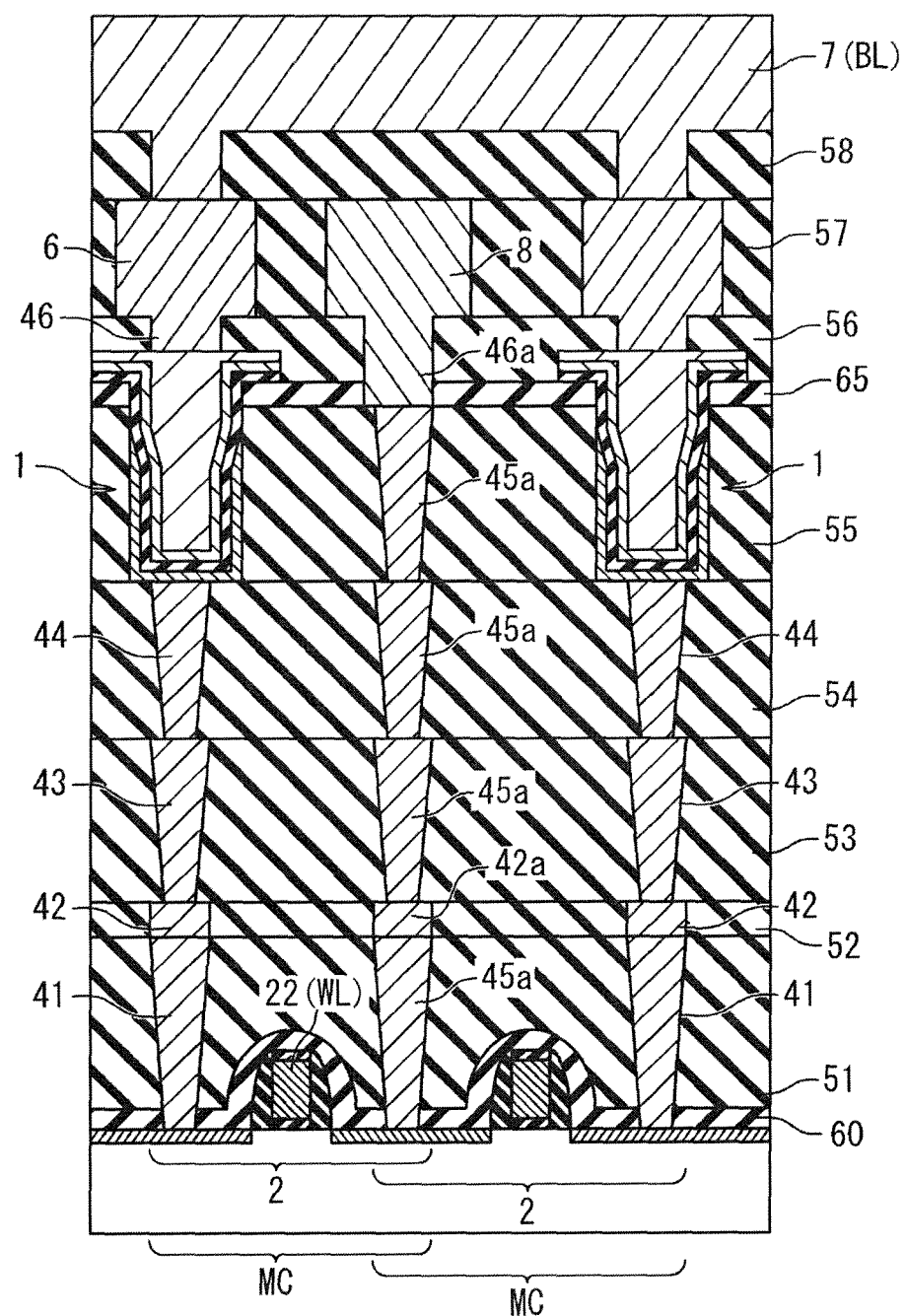
FIG. 9 is a sectional view showing a specific layout of the circuit configuration of FIG. 8.

FIG. 9 is a sectional view showing a specific layout of the circuit configuration of FIG. 8. As shown in FIG. 9, the common line 8, the contact 41a coupling the common line 8 with the transistor 2, the first wiring 42a, the vias 43a, 44a, 45a, and 46a, and the source 24 of the transistor 2 are shared by the two adjacent memory cells MC. As a result, a region necessary for the common line 8, the contact 41a, the wiring 42a, and the vias 43a and 46a, and a region necessary for arrangement of the source 24 of the transistor 2 can be saved by one row per two rows of the memory cells MC. The rest of the configuration is similar to that of FIG. 1 except for an interlayer insulating film 58 and a bit line 7 (BL) coupled to the second wiring 6 being additionally provided over the upper portion thereof.

With the above layout being adopted, the area of the variable resistance memory section 90 can be reduced.

Second Embodiment

With reference to the accompanying drawings, a semiconductor memory device according to the first embodiment of present invention will be described. In the first embodiment, the depths of the first opening 81 and the second opening 181 (cylinder) are adjusted by the etching rate at the time of opening formation. However, according to the present embodiment, the cylinder depth is controlled with use of the cap insulating film. Now, a description thereof will be given in detail.

Figure 10:
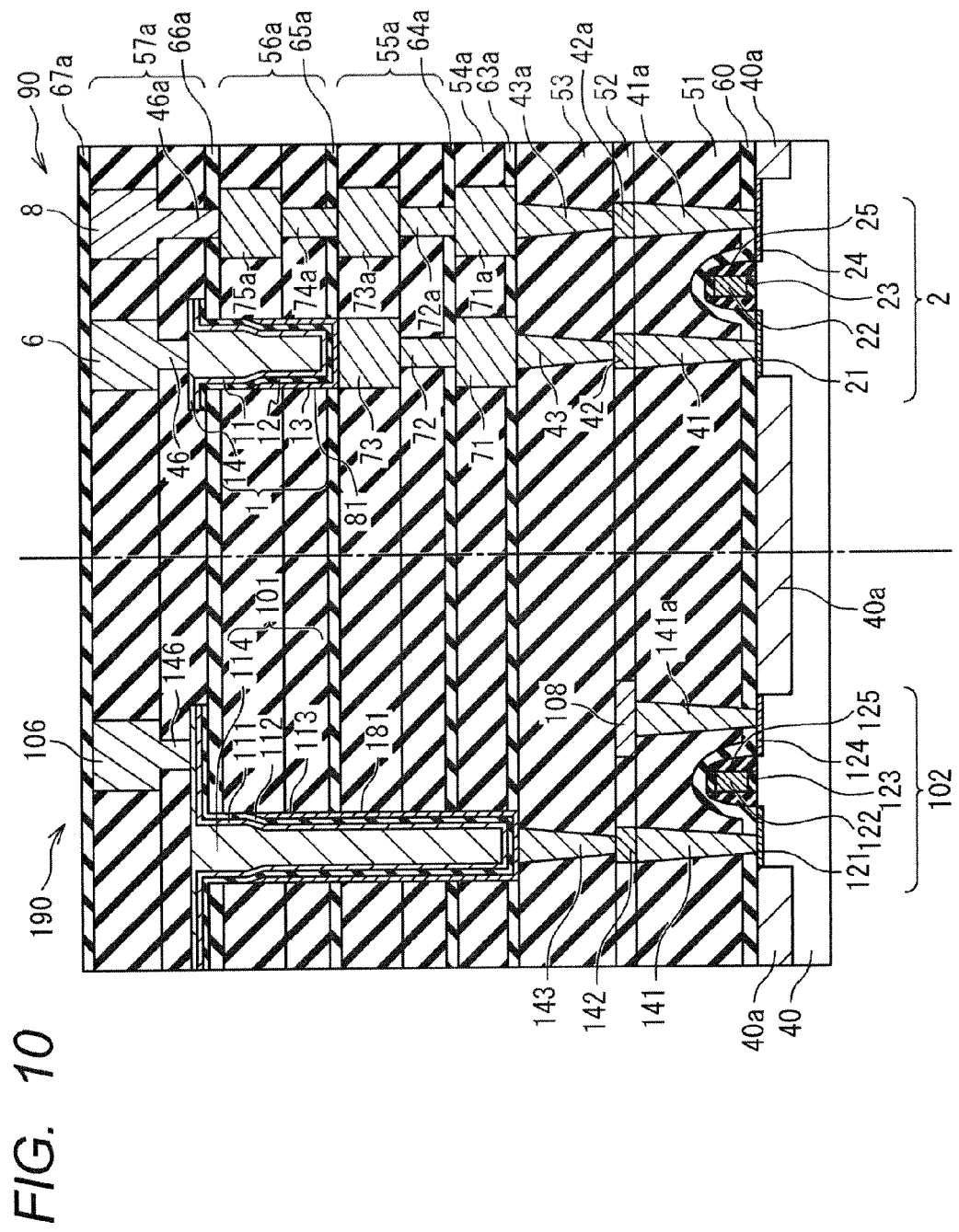
FIG. 10 is a sectional view showing an example of a configuration of a semiconductor memory device according to a second embodiment of the present invention.

With reference to the accompanying drawings, a semiconductor memory device according to a second embodiment of the present invention will be described. FIG. 10 is a sectional view showing an example of a configuration of the semiconductor memory device according the second embodiment of the present invention. The semiconductor memory device is fundamentally the same as that of the first embodiment. However, it differs from the one in the first embodiment in that the variable resistance element 1 and the capacitance element 101 are formed in a metal wiring layer. In this case, for forming the metal wiring, cap insulation films are formed between the interlayer insulation films. Therefore, these cap insulating films can be used as etching stoppers at the time of the opening formation of the variable resistance element 1 and the capacitance element 101. Now, a difference between the first embodiment and the second embodiment will be mainly explained. In FIG. 10 also, a configuration of one variable resistance type memory cell is shown in the variable resistance type memory section 90, and a configuration of one memory cell of the DRAM is shown in the DRAM section 190.

First, the variable resistance type memory section 90 will be described. The interlayer insulating layer is formed by stacking the interlayer insulating film 60, interlayer insulating films 51, 52, and 53, a cap insulating film 63a, an interlayer insulating film 54a, a cap insulating film 64a, an interlayer insulating film 55a, a cap insulating film 65a, an interlayer insulating film 56a, a cap insulating film 66a, an interlayer insulating film 57a, and a cap insulating film 67a, in this order. The drain 21 is coupled to the variable resistance element 1 through the contact 41 penetrating the interlayer insulating film 60 and the interlayer insulating films 51 to 53, the first wiring 42, the via 43, a wiring 71, a via 72, and a wiring 73. The variable resistance element 1 is formed in the first opening 81 with the first depth D1 and the diameter φ1 extending from a surface of the cap insulating film 66a toward the interlayer insulating layer 56a and the cap insulating film 65a. There is the wiring 73 at the bottom of the first opening 81. The embedded electrode 14 is coupled to the second wiring 6 (for example, a bit line) through the via 46 which penetrates the interlayer insulating layer 57a. The source 24 is coupled to the common line 8 (for example, aground line) through the interlayer insulating film 60, the interlayer insulating films 51 to 53, the cap insulating film 63a, the interlayer insulating film 54a, the cap insulating film 64a, the interlayer insulating film 55a, the cap insulating film 65a, the interlayer insulating film 56a, the cap insulating film 66a, the contact 41a penetrating the interlayer insulating film 57a, the first wiring 42a, the via 43a, a wiring 71a, a via 72a, a wiring 73a, a via 74a, a wiring 75a, and a via 46a. The contact 41, the first wiring 42, the via 43, the wiring 71, the via 72, and the wiring 73 can be regarded as contacts which couple the transistor 2 with the variable resistance element 1. Similarly, the contact 41a, the first wiring 42a, the via 43a, the wiring 71a, the via 72a, the wiring 73a, the via 74a, the wiring 75a, and the via 46a can be regarded as contacts for coupling the transistor 2 with the common line 8.

Next, the DRAM section 190 will be described. The interlayer insulating layer is formed by stacking the interlayer insulating film 60, the interlayer insulating films 51, 52, and 53, the cap insulating film 63a, the interlayer insulating film 54a, the cap insulating film 64a, the interlayer insulating film 55a, the cap insulating film 65a, the interlayer insulating film 56a, the cap insulating film 66a, the interlayer insulating film 57a, and the cap insulating film 67a, in this order. The drain 121 is coupled to the capacitance element 101 through the contact 141 penetrating the interlayer insulating film 60 and the interlayer insulating films 51 to 53, the first wiring 142, and the via 143. The capacitance element 101 is formed in the second opening 181 with the second depth D2 and the diameter φ2 extending from a surface of the cap insulating film 66a toward the interlayer insulating layer 56a, the cap insulating film 65a, the interlayer insulating layer 55a, the cap insulating film 64a, the interlayer insulating layer 54a, and the cap insulating film 63a. However, the second depth D2 is deeper than the first depth D1. The embedded electrode 114 is coupled to the second wiring 106 (the ground line) through the via 146 which penetrates the interlayer insulation layer 57a.

The rest of the configuration is similar to that of the first embodiment.

A method of manufacturing a semiconductor device according to the second embodiment of the present invention is fundamentally the same as that of the first embodiment. However, with respect to the variable resistance type memory section 90, when forming the first opening 81 (cylinder), after etching of the cap insulation film 66a, etching of the interlayer insulating layer 56a is performed using the cap insulating film 65a as an etching stopper. Then, etching of the cap insulation film 65a is performed to expose the wiring 73. On the other hand, with respect to the DRAM section 190, when forming the second opening 181 (cylinder), after etching of the cap insulating film 66a, etching of the interlayer insulating layer 56a is performed using the cap insulating film 65a as an etching stopper. After the etching of the cap insulating film 65a, using the cap insulating film 64a as an etching stopper, etching of the interlayer insulation layer 55a is performed. After etching of the cap insulation film 64a, using the cap insulating film 63a as an etching stopper, etching of the interlayer insulation layer 54a is performed. Then, etching of the cap insulating film 63a is performed to expose the via 43.

According to the present embodiment also, effects similar to those in the first embodiment can be obtained. In the manufacturing method described above, the depths of the first opening 81 and the second opening 181 (cylinder) are controlled with use of the cap insulation film. Therefore, as compared to the method of adjusting the depth according to the etching rate, it is easier to control and it becomes possible to further reduce the variation in manufacturing.

Third Embodiment

Figure 11:
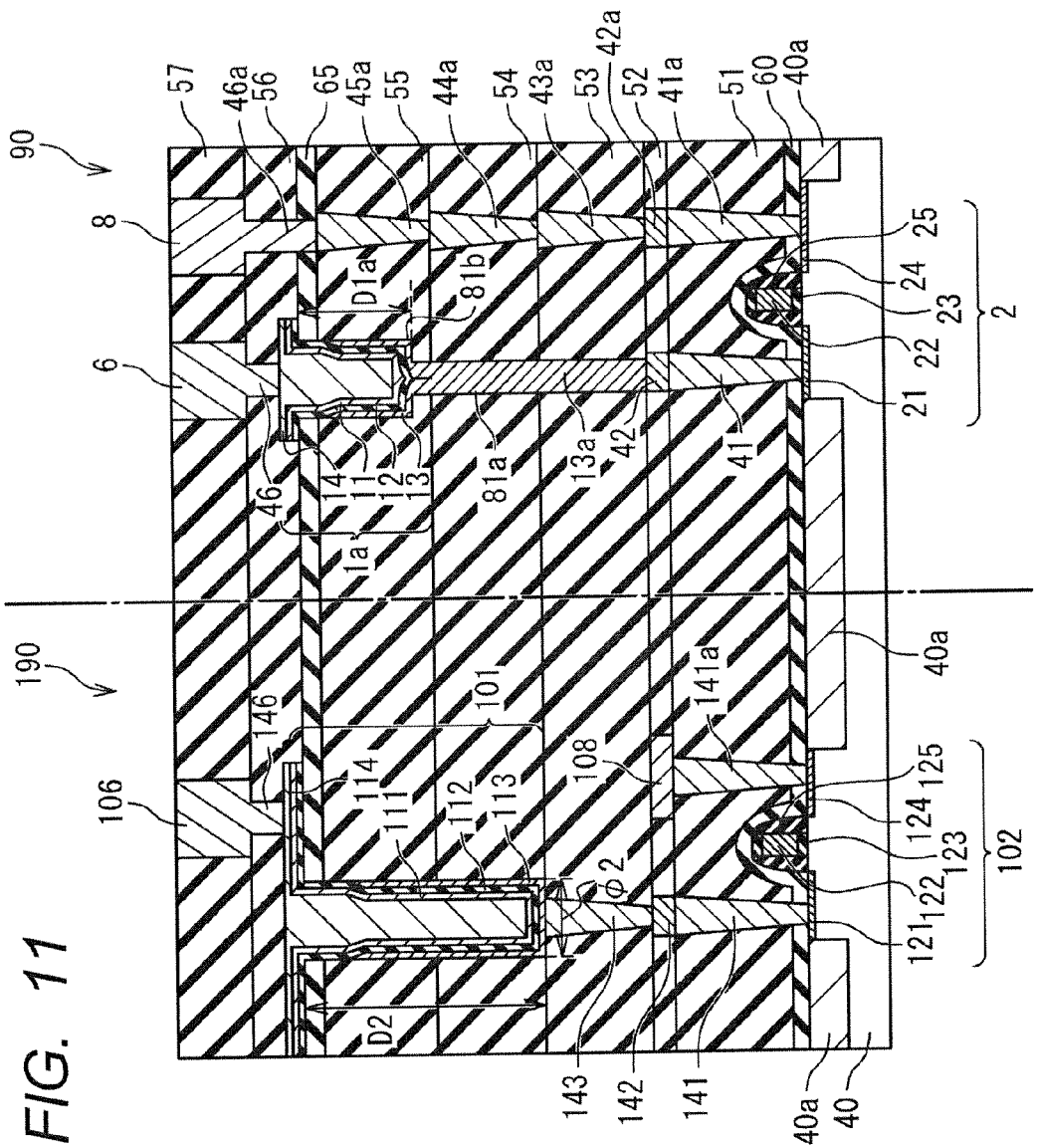
FIG. 11 is a sectional view showing an example of a configuration of a semiconductor memory device according to a third embodiment of the present invention.

With reference to the accompanying drawings, a semiconductor memory device according to a third embodiment of the present invention will be described. In the first embodiment, the contact and the via between the variable resistance element 1 and the transistor 2 are prepared before formation of the variable resistance element 1. However, according to the present embodiment, the contact and the via between a variable resistance element 1a and the transistor 2 are not completely formed, and the variable resistance element 1a and the transistor 2 are coupled by a lower electrode embedded into a newly formed contact hole, which will be described in detail below With reference to the accompanying drawings, the semiconductor memory device according the third embodiment of the present invention will be described. FIG. 11 is a sectional view showing an example of a configuration of the semiconductor memory device according to the third embodiment of the present invention. The semiconductor memory device is fundamentally the same as that of the first embodiment. However, the semiconductor memory device 2 differs from that of the first embodiment in that the variable resistance element 1a is coupled to the transistor 2 with use of the lower electrode embedded in the newly formed contact hole. The difference between the first embodiment and the second embodiment will be mainly explained below. However, in FIG. 11 also, a configuration of one memory cell of the variable resistance type is shown in the variable resistance type memory section 90, and a configuration of one memory cell of the DRAM is shown in the DRAM section 190.

Now, the variable resistance type memory section 90 will be described. The drain 21 of the transistor 2 is coupled to the variable resistance element 1a through the contact 41 which penetrates the interlayer insulation film 60 and the interlayer insulation films 51 to 54, the first wiring 42, and a lower electrode contact 13a. However, the lower electrode contact 13a is a contact which couples the first wiring 42 with the variable resistance element 1a, and is disposed in a lower electrode contact hole 81a provided between the first wiring 42 and the variable resistance element 1a. The lower electrode contact 13a penetrates the interlayer insulating films 53 and 54 and part of the interlayer insulating film 55. The contact 41, the first wiring 42, and the lower electrode contact 13a can be regarded as contacts which couple the variable resistance element 1 with the transistor 2.

The variable resistance element 1a is provided in a first opening 81b with a first depth D1a and a diameter 1 extending from a surface of the cap insulating film 65 toward the interlayer insulating layer 55. A position of the bottom portion of the first opening 81b does not have to be a border plane of the interlayer insulating film, but it can be any desired position. It is because a via is not formed in the interlayer insulating layer below the first opening 81b. At that time, being in contact with the transistor 2 poses a problem. However, in the present embodiment, before forming the first opening 81b, there is provided the lower electrode contact hole 81a coupled with the lower first wiring 42. Accordingly, when forming a conductive film for the lower electrodes, the lower electrode 13 can be formed while filling the lower electrode contact hole 81a. As a result, the lower electrode contact 13a can couple the first wiring 42 with the lower electrode 13.

The rest of the configuration is similar to that of the first embodiment.

Figure 12:
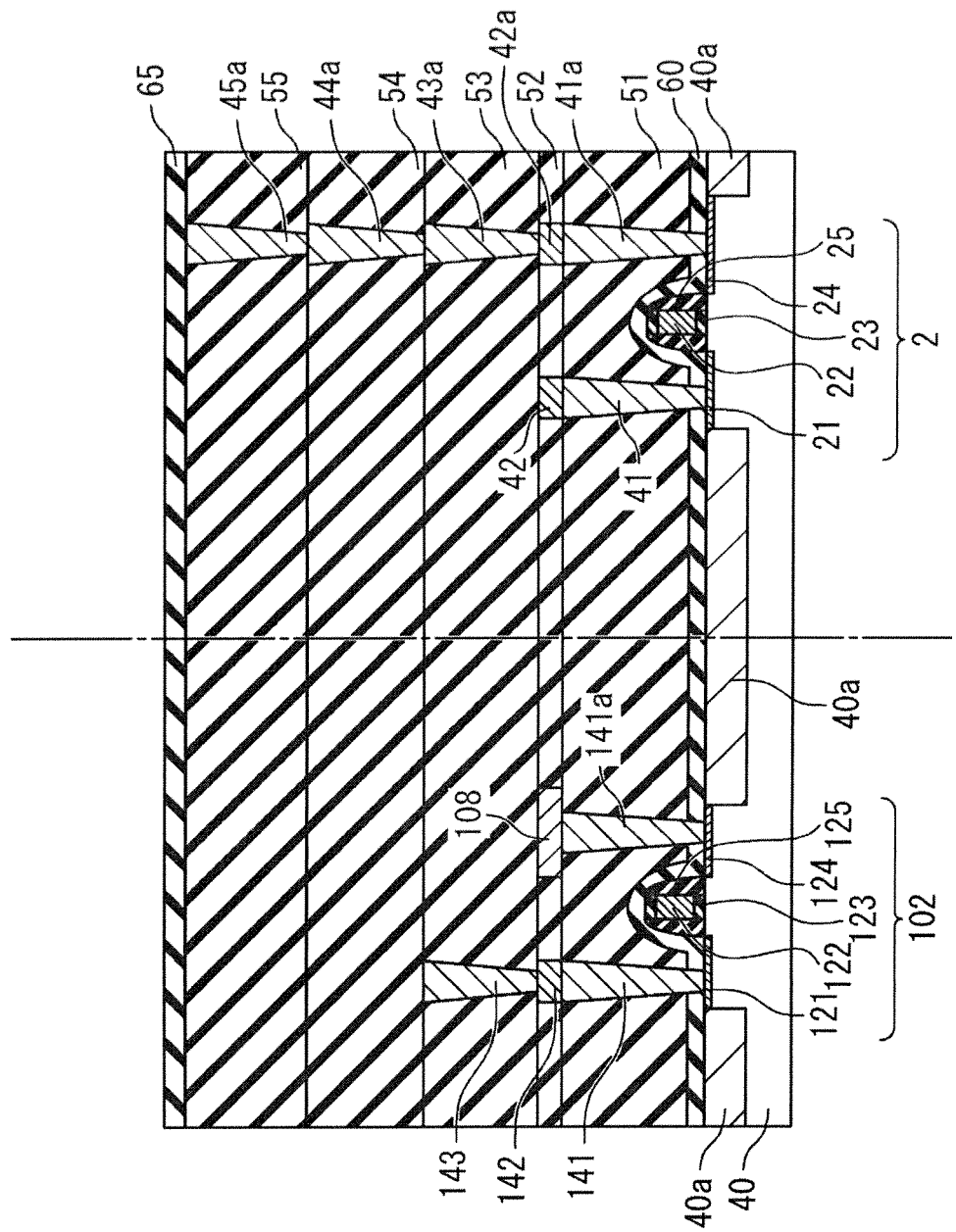
FIG. 12 is a sectional view showing part of a method of manufacturing the semiconductor device according to the third embodiment of the present invention.
Figure 13:
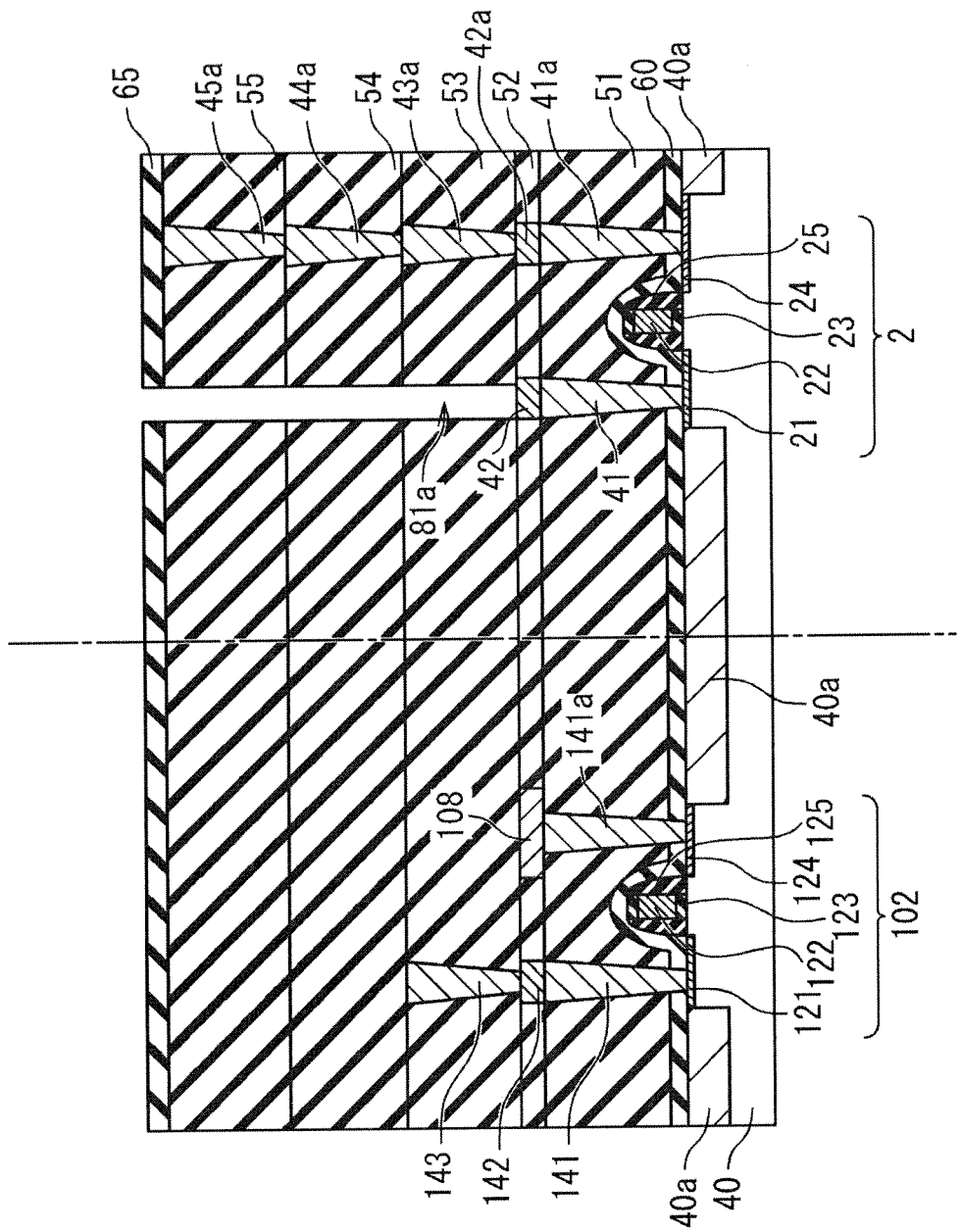
FIG. 13 is a sectional view showing part of the method of manufacturing the semiconductor device according the third embodiment of the present invention.
Figure 14:
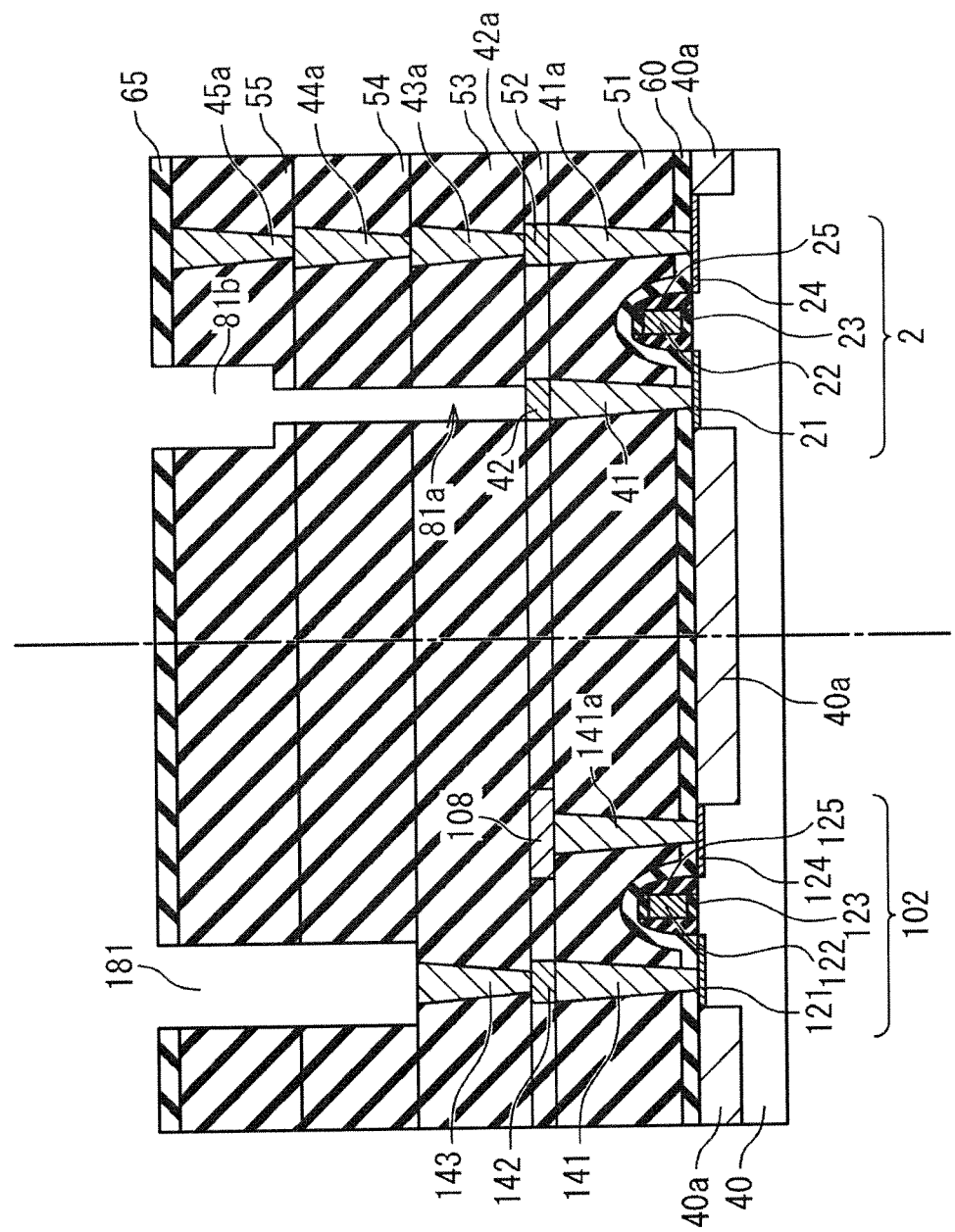
FIG. 14 is a sectional view showing part of the method of manufacturing the semiconductor device according to the third embodiment of the present invention.

Next, a method of manufacturing a semiconductor device according to the third embodiment of the present invention will be described. FIGS. 12 to 14 are sectional views showing part of the method of manufacturing the semiconductor device according to the third embodiment of the present invention. However, the manufacturing method of an example of the configuration of FIG. 11 will be explained here.

First, as shown in FIG. 12, in the variable resistance type memory section 90 and the DRAM section 190, there are formed, with use of a regular MOSFET process, an element isolation region 40a, the transistor 2 (the gate 22, the gate insulating film 23, the source 24, the drain 21, and the sidewall 25), and the transistor 102 (the gate 122, the gate insulating film 123, the source 124, the drain 121, and the sidewall 125) over the semiconductor substrate 40. In this regard, p-silicon (Si) is used for the semiconductor substrate 40, a silicon oxide film (SiOx) is used for the gate insulating films 23 and 123, a polysilicon film (poly-Si) is used for the gates 22 and 122, n+silicon (n+Si) is used for the sources 24 and 124 and drains 21 and 121, and a silicon nitride film (SiNx) is used for the sidewalls 25 and 125, respectively. At this time, the gate insulating film 23 is formed thicker than the gate insulating film 123. A method for allowing it to be thicker is similar to that of the first embodiment.

Next, over the variable resistance type memory section 90 and the DRAM section 190, the interlayer insulating film 60, the interlayer insulating films 51, 52, 53, 54, and 55, and the cap insulating film 65 are stacked, in this order. At this time, using the PR (photoresist) process and the dry etching process, in the interlayer film 60 and the interlayer film 51, the contacts 41 and 41a are formed over the drain 21 and the source 24, and the contacts 141 and 141a are formed over the drain 121 and the source 124. Further, in the interlayer insulating film 52, the first wirings 42 and 42a are formed over the contacts 41 and 41a, and the first wiring 142 and the bit line 108 are formed over the contact 141 and 141a. Still further, in the interlayer insulating film 53, the via 43a is formed over the first wiring 42a, and the via 143 is formed over the first wiring 142. Still further, in the interlayer insulating film 54, the via 44a is formed over the via 43a. Still further, in the interlayer insulating film 55, the via 45a is formed over the via 44a.

Next, as shown in FIG. 13, in the variable resistance type memory section 90, with use of the PR process and the dry etching process, the lower electrode contact hole 81a is so formed as to penetrate the cap insulating film 65 and the interlayer insulating films 53 to 55 to be located over the first wiring 42. The lower electrode contact hole 81a is a hole for the lower electrode contact 13a which couples the variable resistance element 1 with the drain 21 through the first wiring 42 and the contact 41. Being provided for the contact, its diameter is smaller than that of the first opening 81b for the variable resistance element 1a.

Next, as shown in FIG. 14, in the variable resistance type memory section 90, with use of the PR process and the dry etching process, the first opening 81b (depth D1a, diameter φ1) is formed. The first opening 81b is formed at a position where the lower electrode contact hole 81a is overlapped with a central axis. Moreover, the first opening 81b is so formed as to penetrate the cap insulating film 65 and the interlayer insulating film 55 to have a desired depth. As long as extending up to the first wiring 42, the etching depth (D1a) is not restricted by the position of the via below. The etching depth (D1a) is adjusted according to the etching rate. Moreover, in the DRAM section 190, with use of the PR process and the dry etching process, the second opening 181 (depth D2, diameter φ2) is formed so as to penetrate the cap insulating film 65 and the interlayer insulation films 55 and 54 to be located over the via 143. The etching depth (D2) is adjusted according to the etching rate.

Subsequent processes are similar to those in FIGS. 4 to 7 of the first embodiment. However, in FIG. 4, the conductive film 83 for the lower electrode film is so formed as not only to cover a surface of the cap insulating film 65 and inner surfaces (a side surface and a bottom surface) of the first opening 81 and the second opening 181 but also to be the lower electrode contact 13a by filling the lower electrode contact hole 81a.

Thus, the semiconductor device according to the third embodiment of the present invention is manufactured.

According to the present embodiment also, effects similar to those in the first embodiment can be obtained. Moreover, according to the manufacturing method described above, the contact between the variable resistance element 1a and the first wiring 42 below is formed simultaneously with the formation of the lower electrode 13. Therefore, the cylinder depth (D1) of the variable resistance element 1a does not depend on a thickness of the interlayer insulating film but can be set to a given depth. That is, the flexibility of designing the variable resistance element 1a can be improved.

Figure 15:
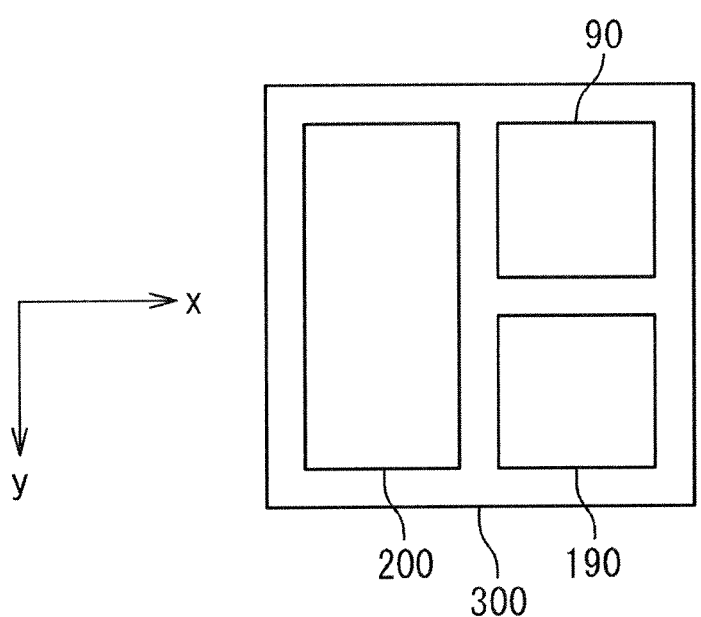
FIG. 15 is a schematic diagram showing a configuration of a semiconductor device on which the semiconductor memory device according to each embodiment of the present invention and an information processing circuit are mounted together.

Each of the above embodiments of the present invention is applicable also to a semiconductor device over which a memory and an information processing circuit are mounted together. FIG. 15 is a schematic diagram showing a configuration of a semiconductor device over which there are mounted a semiconductor memory device (the variable resistance type memory section 90 and the DRAM section 190) according to each embodiment of the present invention and an information processing circuit. The semiconductor device 300 includes: the semiconductor memory device according to each embodiment of the present invention (including the variable resistance type memory section 90 and the DRAM section 190) and the information processing circuit 200 which processes information using the semiconductor memory device. An example of the information processing circuit 200 is a logic circuit (logic LSI) including a CPU (Central Processing Unit). Also in this case, effects similar to those in the above embodiments can be obtained.

It is apparent that the present invention is not limited to the above embodiments, but may be modified and changed without departing from the technical idea of the invention. Moreover, the technology of each embodiment is applicable also to other embodiments, unless technical inconsistency occurs.

What is claimed is:

1. A semiconductor memory device, comprising:
   a variable resistance element of a variable resistance type memory having a cylinder type NUM (Metal-Insulator-Metal) structure with a first depth;
   a capacitance element of a DRAM (Dynamic Random Access Memory) having a cylinder type MIM structure with a second depth deeper than the first depth; and
   wherein the variable resistance element comprises a first lower electrode, a variable resistance layer provided over the first lower electrode, and a first upper electrode provided over the variable resistance layer,
   wherein the capacitance element comprises a second lower electrode, a capacitance insulating film provided over the second lower electrode, and a second upper electrode provided over the capacitance insulating film, and
   wherein an end portion of the first upper electrode and an end portion of the second upper electrode are provided in one plane.

2. The semiconductor memory device according to claim 1, wherein the first lower electrode and the second lower electrode are made using the same material, the variable resistance layer and the capacitance insulating film are made using the same material, and the first upper electrode and the second upper electrode are made using the same material.

3. The semiconductor memory device according to claim 1, wherein the first lower electrode and a contact coupled to the first lower electrode are made using the same material.

4. The semiconductor memory device according to claim 1, further comprising:
   a first transistor coupled to the variable resistance element; and
   a second transistor coupled to the capacitance element,
   wherein a withstand voltage of the first transistor is higher than that of the second transistor.

5. The semiconductor device according to claim 1, wherein the variable resistance type memory is used as a ROM (Read Only Memory).

6. The semiconductor device according to claim 1, wherein a forming operation of the variable resistance element is performed in order to form a low resistive conductive path in the insulating film.

7. A semiconductor device, comprising: a semiconductor memory device according to claim 1; and an information processing circuit which processes information using the semiconductor memory device.

* * * * *